United States Patent
Tanaka et al.

(10) Patent No.: US 6,987,811 B2
(45) Date of Patent: Jan. 17, 2006

(54) IMAGE PROCESSOR AND IMAGE PROCESSING METHOD

(75) Inventors: Takaharu Tanaka, Katano (JP);
Hideshi Nishida, Nishinomiya (JP);
Kosuke Yoshioka, Neyagawa (JP);
Tokuzo Kiyohara, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 721 days.

(21) Appl. No.: 10/048,360

(22) PCT Filed: May 31, 2001

(86) PCT No.: PCT/JP01/04627
§ 371 (c)(1),
(2), (4) Date: Feb. 1, 2002

(87) PCT Pub. No.: WO01/95637
PCT Pub. Date: Dec. 13, 2001

(65) Prior Publication Data
US 2002/0114528 A1 Aug. 22, 2002

(30) Foreign Application Priority Data
Jun. 2, 2000 (JP) ........................................ 2000-166312

(51) Int. Cl.
*H04N 7/12* (2006.01)

(52) U.S. Cl. ................................................. 375/240.25

(58) Field of Classification Search ............ 375/240.01–240.03, 375/375/375/375/ 375/240.12, 240.13, 240.14, 240.15, 240.16, 375/240.2, 240.23, 240.24, 240.25, 240.26; 382/233, 246, 250–251
See application file for complete search history.

(56) References Cited

U.S. PATENT DOCUMENTS

| | | | | | |
|---|---|---|---|---|---|
| 5,369,405 A | * | 11/1994 | Choi et al. | .................... | 341/63 |
| 5,706,001 A | * | 1/1998 | Sohn | ............................ | 341/63 |
| 5,751,357 A | * | 5/1998 | Geib | ....................... | 348/400.1 |
| 5,828,425 A | * | 10/1998 | Kim | ....................... | 375/240.26 |
| 5,933,536 A | * | 8/1999 | Fukuzawa | ................... | 382/246 |
| 6,144,322 A | * | 11/2000 | Sato | ............................ | 341/67 |
| 6,292,589 B1 | * | 9/2001 | Chow et al. | ................ | 382/239 |
| 6,414,608 B1 | * | 7/2002 | Nishida et al. | ............... | 341/67 |

FOREIGN PATENT DOCUMENTS

| | | |
|---|---|---|
| JP | 3-177163 | 8/1991 |
| JP | 3-293865 | 12/1991 |

(Continued)

*Primary Examiner*—Chris Kelley
*Assistant Examiner*—Dave Czekaj
(74) *Attorney, Agent, or Firm*—McDermott Will & Emery LLP

(57) ABSTRACT

The speed of decoding processing for variable-length coded image data is improved. The image processor includes a variable-length decoding unit for variable-length decoding input data and outputting a pair of the run length of zero coefficients and a non-zero coefficient; an inverse quantization unit for subjecting the non-zero coefficient to inverse quantization and obtaining inverse quantized data to be output; an address setting unit for carrying out inverse scanning, obtaining an address for storing the inverse quantized data on the basis of the run length of zero coefficients and specifying the address in the data storage unit; a write information storage unit for setting a write flag in an address thereof corresponding to the specified address; and a data reading unit for reading data from the data storage unit, and on the basis of information stored in the write information storage unit, directly outputting data from the address specified by the address setting unit while substituting a predetermined value for data from an address other than the specified address to output the substituted value.

5 Claims, 8 Drawing Sheets

FOREIGN PATENT DOCUMENTS

| | | |
|---|---|---|
| JP | 4-220082 | 8/1992 |
| JP | 5-56271 | 3/1993 |
| JP | 05-056270 | 3/1993 |
| JP | 05-056271 | 3/1993 |
| JP | 06-188742 | 7/1994 |
| JP | 10-023261 | 1/1998 |
| JP | 10-136363 | 5/1998 |
| JP | 11-096138 | 4/1999 |

* cited by examiner

IMAGE PROCESSOR AND IMAGE PROCESSING METHOD

TECHNICAL FIELD

The present invention relates to an image processor for decoding an image encoded by a technique such as MPEG (moving picture experts group).

BACKGROUND ART

In an image processor for decoding a variable-length coded string such as an MPEG stream, there recently is increasing necessity for decoding an HD (high definition) image including a large number of pixels and the like, and it is necessary to increase the speed of the decoding processing.

FIG. 4 is an explanatory diagram of processing performed in a conventional image processor. FIG. 4A is a diagram for explaining a processing unit of an image. For example, in an HD image, one screen includes 1920×1080 pixels, and in a standard image, one screen includes 720×480 pixels. Such a screen is processed in a unit of 16×16 pixels designated as a macroblock. A macroblock is divided, for processing, into six blocks each including 8×8 pixel data, namely, four luminance blocks Y0, Y1, Y2 and Y3 and two chrominance blocks Cb and Cr.

FIG. 4B is a diagram for explaining a bit stream of variable-length coded image data. Data corresponding to every macroblock are transferred in the order of a header, the luminance blocks Y0 through Y3 and the chrominance blocks Cb and Cr.

FIG. 4C is a diagram for explaining pipeline processing performed in the conventional image processor. In the decoding processing, the pipeline processing is generally carried out in units of blocks each including 8×8 pixels for increasing the speed of the processing. Specifically, for example, a unit A for carrying out variable-length decoding, inverse quantization and inverse scanning, a unit B for carrying out inverse discrete cosine transform and a unit C for carrying out motion compensation are operated in parallel as shown in FIG. 4C.

In conducting such pipeline processing, the processing of the respective units are preferably ended in an average number of clock cycles. In the unit A, however, all the sixty-four values of every block are subjected to the inverse quantization and the inverse scanning so as to store resultant data, and hence, the number of clock cycles necessary for processing one block is larger than in the other units.

FIG. 5 is a block diagram of the conventional image processor. The image processor of FIG. 5 includes a variable-length decoding part 81, an inverse quantization/inverse scanning part 82 and a data storage part 83 as the unit A, a data reading part 84 and an inverse discrete cosine transform part 85 as the unit B and a motion compensation part 86 as the unit C.

In FIG. 5, the variable-length decoding part 81 variable-length decodes an input bit stream, and converts data of every block into a string of sixty-four values to be successively output to the inverse quantization/inverse scanning part 82. The inverse quantization/inverse scanning part 82 carries out the inverse quantization and the inverse scanning on all the sixty-four values of every block output from the variable/length decoding part 81, so as to store all the resultant DCT coefficients in the data storage part 83.

The data reading part 84 reads the DCT coefficients from the data storage part 83 and outputs them to the inverse discrete cosine transform part 85. The inverse discrete cosine transform part 85 carries out the inverse discrete cosine transform on the DCT coefficients and outputs obtained decoded image data to the motion compensation part 86. The motion compensation part 86 carries out the motion compensation by using the reconstructed image data.

Among DCT (discrete cosine transform) coefficients obtained through variable-length decoding of image data such as an MPEG stream, the proportion of those having a value of 0 is high except for those obtained from a special image. In the conventional image processor as shown in FIG. 5, all the coefficients obtained through the variable-length decoding processing are subjected to the inverse quantization and the inverse scanning so as to store resultant data, which is a bottleneck in increasing the speed of the decoding processing. Also, when such decoding processing is executed on hardware, it is preferred that the processing is realized in a circuit of which area is as small as possible.

DISCLOSURE OF THE INVENTION

The present invention was devised to overcome the problems of the conventional technique, and an object is, in decoding variable-length coded image data, increasing the speed of decoding processing without largely increasing a circuit area by conducting inverse quantization and inverse scanning merely on non-zero coefficients obtained through variable-length decoding.

Specifically, the image processor of this invention is an image processor for decoding variable-length coded image data and includes a variable-length decoding unit for variable-length decoding the image data and outputting a pair of a run length of zero coefficients and a non-zero coefficient; an inverse quantization unit for subjecting the non-zero coefficient to inverse quantization to obtain inverse quantized data and outputting the inverse quantized data; a data storage unit for storing the inverse quantized data in a specified address; an address setting unit for conducting inverse scanning, obtaining the address for storing the inverse quantized data on the basis of the run length of zero coefficients and specifying the address in the data storage unit; a write information storage unit for setting a write flag in an address thereof corresponding to the address specified by the address setting unit; and a data reading unit for reading data from the data storage unit, and on the basis of information stored in the write information storage unit, directly outputting data from the address specified by the address setting unit while substituting a predetermined value for data from an address other than the address specified by the address setting unit to output the substituted value.

Accordingly, since non-zero coefficients alone are subjected to the inverse quantization and the inverse scanning so as to store resultants, the speed of the variable-length decoding can be increased. Also, since the write flag is stored correspondingly to an address where inverse quantized data is stored, the necessary storage capacity is so small that the circuit area can be small.

In the image processor of this invention, data stored in the write information storage unit are preferably reset at given timing. Thus, the write information storage unit can execute the processing on data of another region of the image after the reset.

In the image processor, data stored in the write information storage unit are preferably reset when data of one block are read from the data storage unit by the data reading unit. Thus, the processing can be executed on every block, and hence, each of the data storage unit and the write information storage unit may have a storage capacity according to the number of data values included in one block.

In the image processor of this invention, the write information storage unit preferably has a storage area of one bit in each address thereof. Thus, the storage capacity of the write information storage unit can be small, so as to reduce the circuit area.

The image processing method of this invention is an image processing method for decoding variable-length coded image data and includes a variable-length decoding step of variable-length decoding the image data and outputting a pair of a run length of zero coefficients and a non-zero coefficient; an inverse quantization step of subjecting the non-zero coefficient to inverse quantization to obtain inverse quantized data; an address setting step of conducting inverse scanning, obtaining an address for storing the inverse quantized data on the basis of the run length of zero coefficients and specifying the address in a data storage unit; a data storing step of storing the inverse quantized data in the address specified in the data storage unit; a write information storing step of setting a write flag in an address of a write information storage unit corresponding to the address specified in the address setting step; and a data reading step of reading data from the data storage unit, and on the basis of information stored in the write information storage unit, substituting a predetermined value for data from an address other than the address specified in the address setting step without substituting the value for data from the address specified in the address setting step.

Accordingly, since non-zero coefficients alone are subjected to the inverse quantization and the inverse scanning so as to store resultants, the speed of the variable-length decoding can be increased. Also, since the write flag is stored correspondingly to an address where inverse quantized data is stored, the necessary storage capacity is small.

According to the present invention, there is no need to carry out the inverse quantization and the inverse scanning on zero coefficients after the variable-length decoding, and the number of data values necessary to be stored after the inverse quantization and the inverse scanning is small, and therefore, the speed of the decoding processing can be increased. In particular, since time required for storing data is short, the entire processing can be rapidly carried out in employing pipeline processing. Also, since the storage capacity necessary for the processing is small, the speed can be increased without largely increasing the circuit area.

BEST MODE FOR CARRYING OUT THE INVENTION

A preferred embodiment of the invention will now be described with reference to the drawings.

Figure 1:
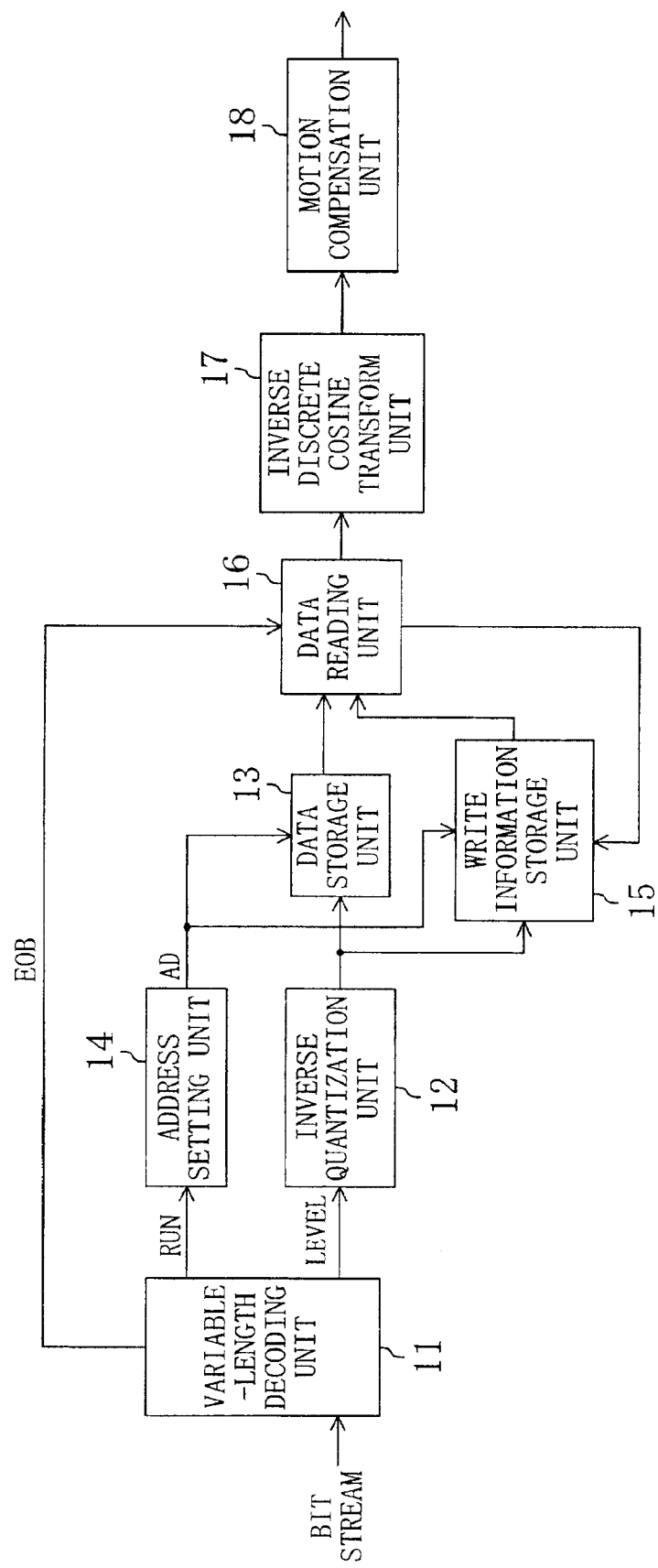
FIG. 1 is a block diagram of an image processor according to an embodiment of the invention.

FIG. 1 is a block diagram of an image processor according to the embodiment of the invention. The image processor of FIG. 1 includes a variable-length decoding unit 11, an inverse quantization unit 12, a data storage unit 13, an address setting unit 14, a write information storage unit 15, a data reading unit 16, an inverse discrete cosine transform unit 17 and a motion compensation unit 18.

A bit stream is input to the variable-length decoding unit 11. Herein, the bit stream is data obtained from image data through DCT, quantization, scanning and variable-length coding performed by MPEG. The DCT of image data results in DCT coefficients, which are further subjected to the quantization and the scanning to give a string of quantized DCT coefficients one-dimensionally arranged. In the string of the quantized DCT coefficients, the run length of zero coefficients (including the case of no zero coefficients) and a following non-zero coefficient are paired for the variable-length coding. Herein, the run length of zero coefficients is designated as a run data value RUN and a non-zero coefficient is designated as a level data value LEVEL.

The variable-length decoding unit 11 carries out the variable-length decoding on the bit stream, so that the bit stream can be decoded into pairs of a run data value RUN and a level data value LEVEL. The variable-length decoding unit 11 outputs the level data value LEVEL to the inverse quantization unit 12 and the run data value RUN to the address setting unit 14.

The inverse quantization unit 12 carries out the inverse quantization on the level data value LEVEL and outputs the resultant inverse quantized data, namely, a non-zero DCT coefficient, to the data storage unit 13 and the write information storage unit 15.

The address setting unit 14 is reset at the beginning of the processing of every block so as to have an initial value "0" as a data order n. The data order n corresponds to the order of a value in a data string including zero obtained through the variable-length decoding. In other words, the data order n corresponds to the order in sixty-four values included in a DCT coefficient block obtained through the scanning. The address setting unit 14 has an incrementer so as to accumulatively add run data values RUN to the data order n. Thereafter, the address setting unit 14 carries out the inverse scanning on the basis of the data order n. In other words, the address setting unit 14 calculates an address AD corresponding to the data order n, namely, an address for storing a non-zero DCT coefficient obtained in the inverse quantization unit 12, by referring to an inverse scan table, and outputs the calculated address to the data storage unit 13 and the write information storage unit 15.

The inverse quantization unit 12 and the address setting unit 14 operate in synchronization with each other so as to output one address AD with respect to one non-zero DCT coefficient. In the data storage unit 13 and the write information storage unit 15, the combination of the DCT coefficient and the address AD can be simultaneously used.

The data storage unit 13 can store sixty-four 12-bit values, which are respectively stored in addresses 0 through 63. Also, the write information storage unit 15 can store sixty-four 1-bit values, which are respectively stored in addresses 0 through 63. The write information storage unit 15 is reset so as to store "0" in all the addresses before starting the processing of every block.

The data storage unit 13 stores the non-zero DCT coefficient in its address identified by the address AD. The write information storage unit 15 sets "1" as the write flag in its address identified by the address AD. In accordance with the data storage unit 13 storing one DCT coefficient, the address setting unit 14 adds "1" to the data order n. Thereafter, data included in one block are successively processed similarly.

When a code EOB (end of block) is input to the variable-length decoding unit 11, it determines that the data of one block have been ended and outputs the code EOB to the data reading unit 16.

Figure 4A:
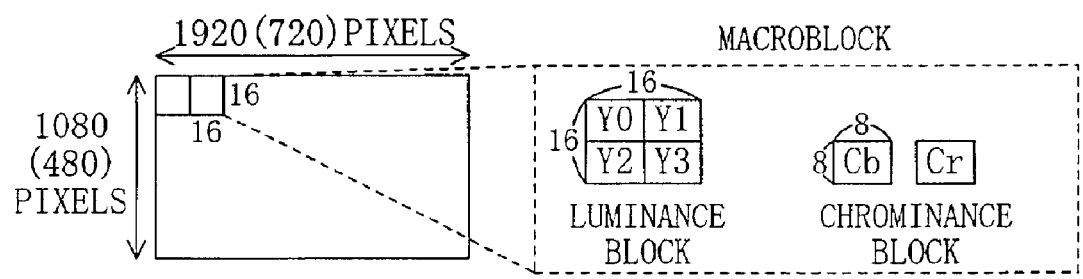
FIG. 4 is an explanatory diagram of processing performed in a conventional image processor.
Figure 4B:
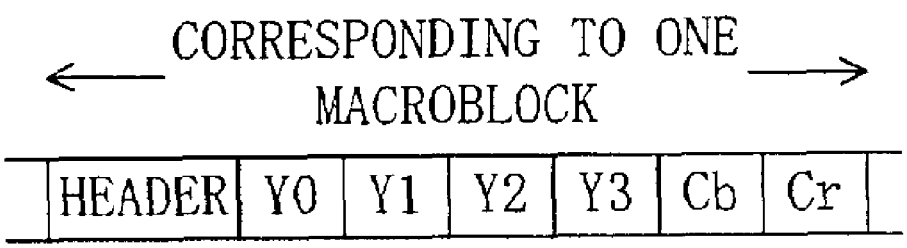
Figure 4C:
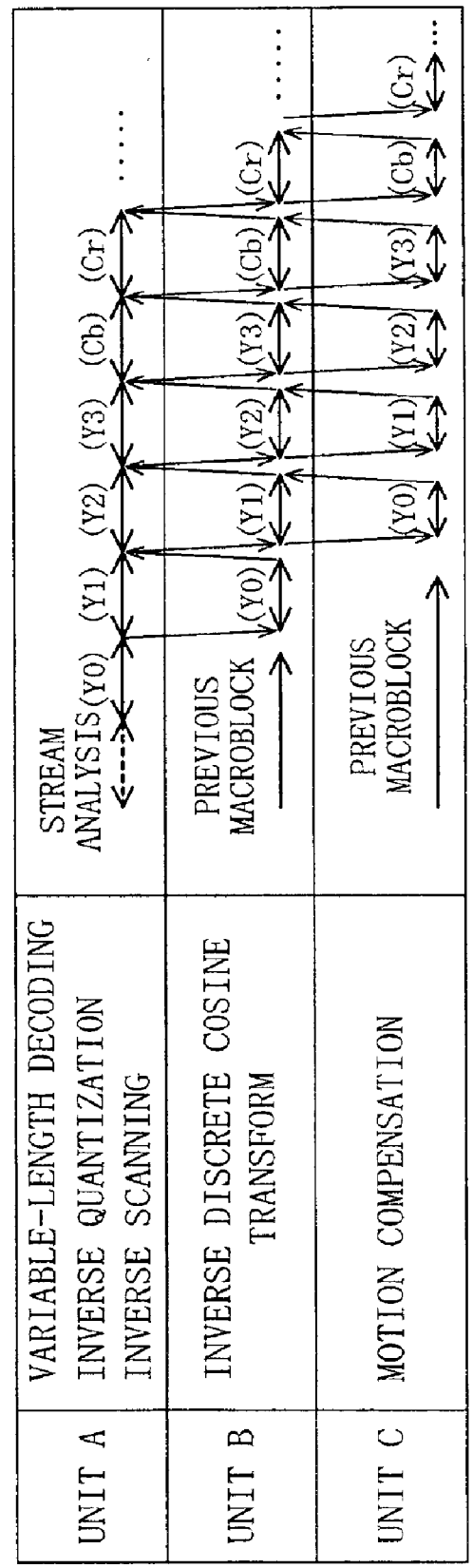
Figure 5:
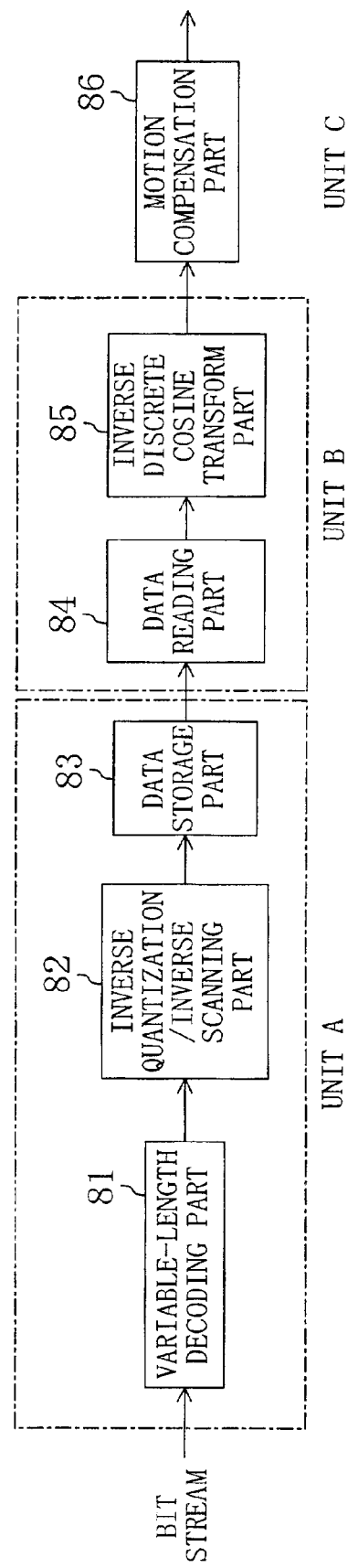
FIG. 5 is a block diagram of the conventional image processor.

In writing a DCT coefficient in the data storage unit 13, time of one clock cycle is necessary for each DCT coefficient. Since the DCT coefficients written in the data storage unit 13 are non-zero coefficients alone, time required for the writing is shorter than in the case where all the sixty-four DCT coefficients of one block are written. Therefore, the time required for the processing of the unit A described with reference to FIG. 4C can be shortened.

When the data reading unit 16 receives the code EOB, it starts reading from the data storage unit 13 and the write information storage unit 15. Each of the data storage unit 13 and the write information storage unit 15 has, for example, four reading ports, so that four data values can be read in one clock cycle.

The data reading unit 16 reads data from the same addresses of the data storage unit 13 and the write information storage unit 15 in the same clock cycle. When the write flag in the same address as the address from which the DCT coefficient is read has a value "1", the data reading unit 16 directly outputs the DCT coefficient to the inverse discrete cosine transform unit 17, and when the write flag in the same address as the address from which the DCT coefficient is read has a value "0", the data reading unit 16 masks the DCT coefficient with "0" to be output to the inverse discrete cosine transform unit 17.

When the data reading unit 16 have read all the sixty-four values of one block from the data storage unit 13 and the write information storage unit 15, the data reading unit 16 outputs read end information to the write information storage unit 15, which resets all the data stored therein to "0".

The inverse discrete cosine transform unit 17 carries out the inverse discrete cosine transform on the DCT coefficients of each block so as to output decoded image data to the motion compensation unit 18. The aforementioned processing is carried out on each of the four luminance blocks Y0, Y1, Y2 and Y3 and the two chrominance blocks Cb and Cr. The motion compensation unit 18 carries out the motion compensation on the reconstructed image data so as to output the resultant.

Figure 2A:
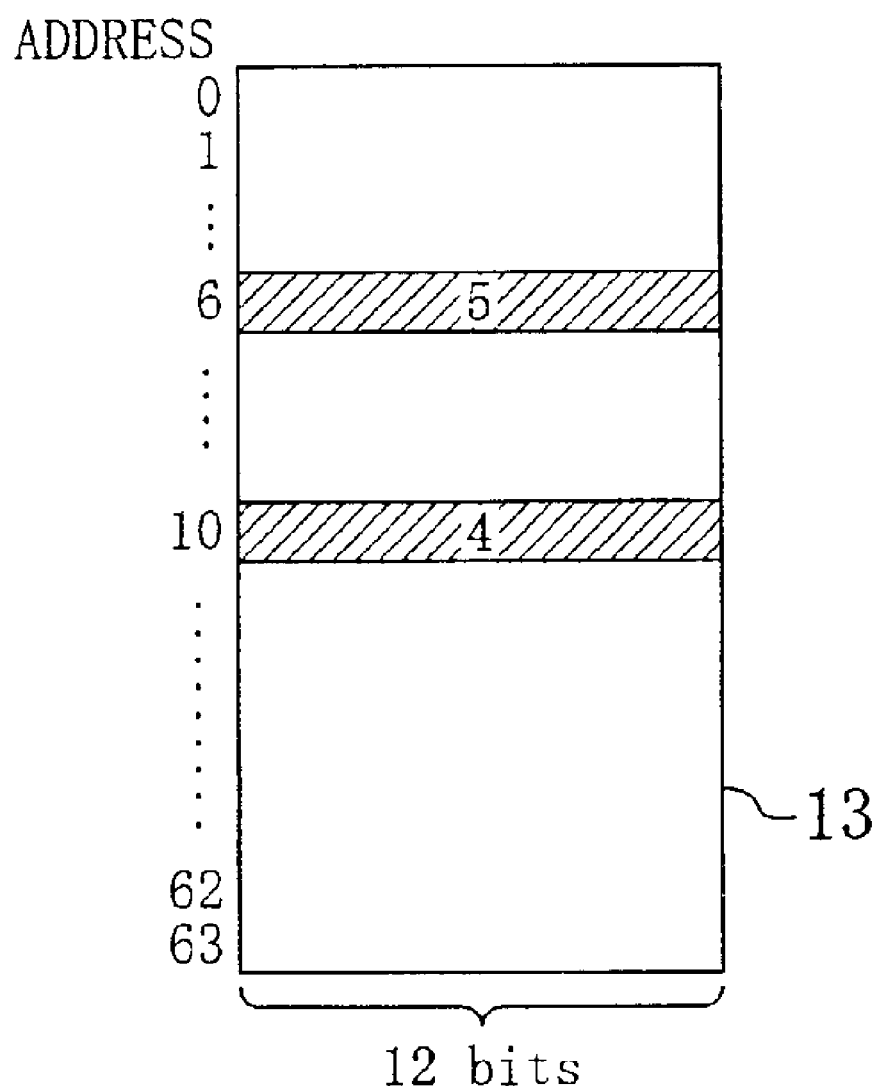
FIG. 2 is an explanatory diagram for showing examples of data stored in a data storage unit and a write information storage unit.
Figure 2B:
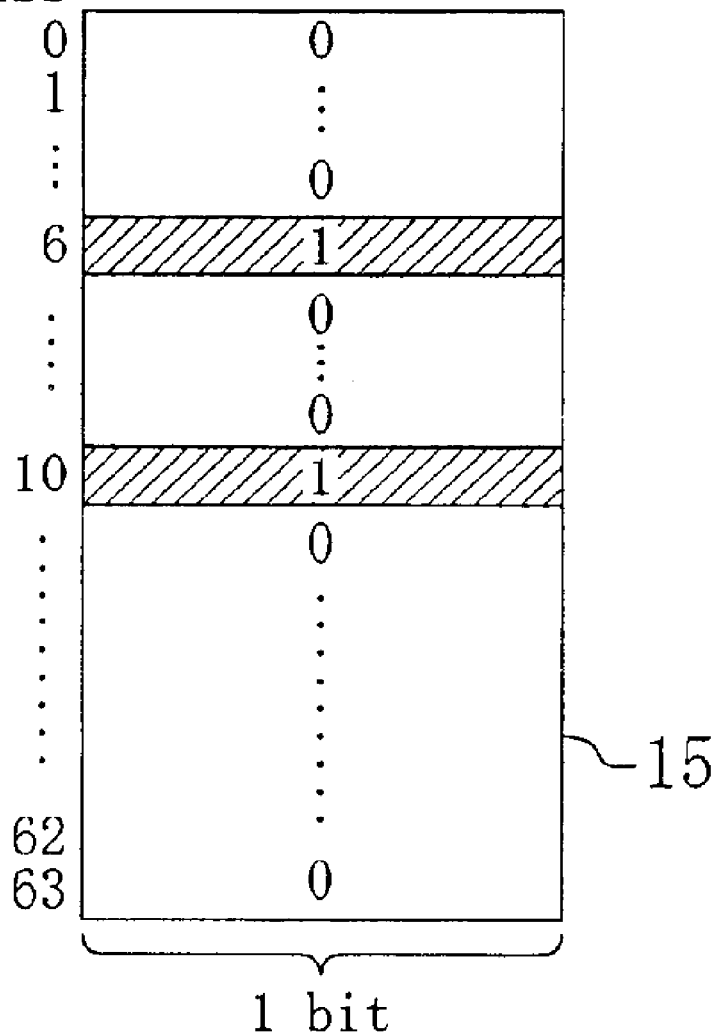

FIG. 2 is an explanatory diagram for showing examples of data stored in the data storage unit 13 and the write information storage unit 15. FIG. 2A shows data stored in the data storage unit 13 and FIG. 2B shows data stored in the write information storage unit 15.

Herein, it is assumed, for example, that the number of non-zero DCT coefficients output by the inverse quantization unit 12 with respect to a given block is two, and specifically, the DCT coefficient first output is "5" and the DCT coefficient second output is "4".

Assuming that the address AD output by the address setting unit 14 when the first DCT coefficient is output is 6, the data storage unit 13 stores the value of the DCT coefficient, "5", in its address 6. At this point, the write information storage unit 15 stores "1" as the write flag also in its address 6. Similarly, assuming that the address AD output by the address setting unit 14 when the second DCT coefficient is output is 10, the data storage unit 13 stores the value of the DCT coefficient, "4", in its address 10. At this point, the write information storage unit 15 stores "1" as the write flag also in its address 10.

Since the data storage unit 13 is not reset for the processing of each block, unnecessary data are stored in its addresses other than the addresses 6 and 10. Since the write information storage unit 15 is reset before starting the processing of each block, "0" are stored in its addresses other than the addresses 6 and 10.

In this manner, the data storage unit 13 and the write information storage unit 15 store the corresponding data in the same address. Accordingly, it is understood that, among data stored in the data storage unit 13, non-zero DCT coefficients of this block are stored in addresses in which "1" is stored in the write information storage unit 15 with unnecessary data stored in the other addresses. The data reading unit 16 substitutes, for example, "0" for the unnecessary data and outputs the substituted value.

Since the write information storage unit 15 has capacity of one bit in each address, a circuit for realizing this unit is very small.

The address for actually storing data in the data storage unit 13 can be the address AD itself or another address corresponding to the address AD on a one-for-one basis. Also, the address for storing data in the write information storage unit 15 can be the same address used in the data storage unit 13 or another address corresponding to the address used in the data storage unit 13 on a one-for-one basis.

Also, although the write information storage unit 15 is described to store 1-bit values, values of 2 or more bits may be stored. Also, data for resetting and data of the write flag may have any values as far as they can be distinguished from each other. For example, "1" may be written in all the addresses in resetting and "0" may be written as a value of the write flag.

Furthermore, the data reading unit 16 is described to output the read end information to the write information storage unit 15 when all the sixty-four values of one block are read from the data storage unit 13 and the write information storage unit 15. The read end information may be output at any timing after the data reading unit 16 reads all the data of one block and before data of a subsequent block is input to the write information storage unit 15.

Figure 3:
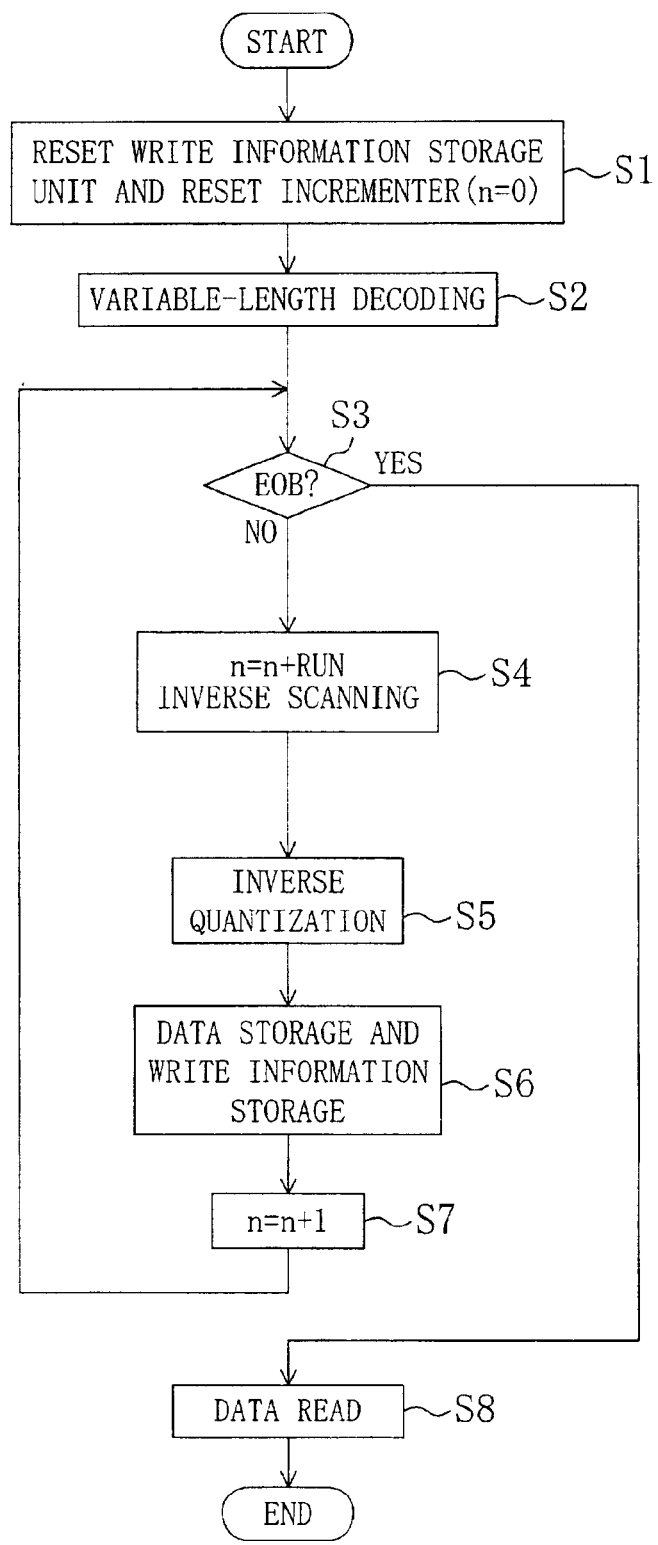
FIG. 3 is a flowchart of processing performed in the image processor of FIG. 1.

FIG. 3 is a flowchart of the processing performed in the image processor of FIG. 1. FIG. 3 shows the processing carried out on data of every block in the variable-length decoding unit 11, the inverse quantization unit 12, the data storage unit 13, the address setting unit 14, the write information storage unit 15 and the data reading unit 16 of the image processor of FIG. 1.

In FIG. 3, in step S1, the write information storage unit 15 is reset so as to set all the stored contents to "0", and the address setting unit 14 is reset so as to set the data order n within the current block to "0".

In step S2, an input bit stream is subjected to the variable-length decoding, so as to obtain a run data value RUN and a level data value LEVEL.

In step S3, it is determined whether or not decoded data currently processed is the code EOB. When the data is the code EOB, the procedure proceeds to step S8, and when the data is not the code EOB, the procedure proceeds to step S4.

In step S4, the value of the run data value RUN is added to the data order n. Also, on the basis of the obtained data order n, an address AD for storing a non-zero DCT coefficient obtained in step S5 (inverse quantized data) is obtained by referring to an inverse scan table.

In step S5, the level data value LEVEL is subjected to the inverse quantization so as to obtain a non-zero DCT coefficient.

In step S6, the non-zero DCT coefficient is stored in the address AD of the data storage unit 13, and the write flag is set in an address of the write information storage unit 15 corresponding to the address AD.

In step S7, 1 is added to the data order n in accordance with storage of one non-zero DCT coefficient. Thereafter, the procedure returns to step S3.

In step S8, data is read from the data storage unit 13, and on the basis of data in the write information storage unit 15, data read from an address storing a non-zero DCT coefficient is allowed to remain the same, and data read from an address not storing a non-zero DCT coefficient is replaced with, for example, "0".

Steps S4 and S5 may be executed in the reverse order or simultaneously.

The address setting unit 14 has the incrementer for addition in this embodiment, which does not limit the invention, and a decrementer for subtraction from a predetermined value may be used instead.

Also, the inverse discrete cosine transform unit 17 may have the function of the data reading unit 16.

Furthermore, the present invention is applicable to data encoded by any of MPEG1, MPEG2 and MPEG4. Also, it is applicable to data encoded not only by the MPEG but also by any method accompanied by variable-length coding such as JPEG.

What is claimed is:

1. An image processor for decoding variable-length coded image data, comprising:

a variable-length decoding unit for variable-length decoding said image data and outputting a pair of a run length of zero coefficients and a non-zero coefficient;

an inverse quantization unit for subjecting said non-zero coefficient to inverse quantization to obtain inverse quantized data and outputting said inverse quantized data;

a data storage unit for storing said inverse quantized data in a specified address;

an address setting unit for conducting inverse scanning, obtaining said address for storing said inverse quantized data on the basis of the run length of zero coefficients and specifying said address in said data storage unit;

a write information storage unit for setting a write flag in an address thereof corresponding to said address specified by said address setting unit; and a data reading unit for reading data from said data storage unit, and on the basis of information stored in said write information storage unit, directly outputting data from said address specified by said address setting unit while substituting a predetermined value for data from an address other than said address specified by said address setting unit to output the substituted value.

2. The image processor of claim 1, wherein data stored in said write information storage unit are reset at given timing.

3. The image processor of claim 2, wherein data stored in said write information storage unit are reset when data of one block are read from said data storage unit by said data reading unit.

4. The image processor of claim 1, wherein said write information storage unit has a storage area of one bit in each address thereof.

5. An image processing method for decoding variable-length coded image data, comprising:

a variable-length decoding step of variable-length decoding said image data and outputting a pair of a run length of zero coefficients and a non-zero coefficient;

an inverse quantization step of subjecting said non-zero coefficient to inverse quantization to obtain inverse quantized data;

an address setting step of conducting inverse scanning, obtaining an address for storing said inverse quantized data on the basis of the run length of zero coefficients and specifying said address in a data storage unit;

a data storing step of storing said inverse quantized data in said address specified in said data storage unit;

a write information storing step of setting a write flag in an address of a write information storage unit corresponding to said address specified in the address setting step; and a data reading step of reading data from said data storage unit, and on the basis of information stored in said write information storage unit, substituting a predetermined value for data from an address other than said address specified in the address setting step without substituting the value for data from said address specified in the address setting step.

* * * * *